(12) United States Patent
Potter

(10) Patent No.: US 10,584,901 B2
(45) Date of Patent: Mar. 10, 2020

(54) SOLAR MODULE ARRAY PRE-ASSEMBLY METHOD AND APPARATUS

(71) Applicant: OpTerra Energy Services, Inc., Overland Park, KS (US)

(72) Inventor: David S. Potter, Danville, CA (US)

(73) Assignee: ENGIE SERVICES U.S. INC., Overland Park, KS (US)

(*) Notice: Subject to any disclaimer, the term of this patent is extended or adjusted under 35 U.S.C. 154(b) by 256 days.

(21) Appl. No.: 15/450,597

(22) Filed: Mar. 6, 2017

(65) Prior Publication Data

US 2017/0176051 A1 Jun. 22, 2017

Related U.S. Application Data

(60) Continuation of application No. 14/055,978, filed on Oct. 17, 2013, now abandoned, which is a division of (Continued)

(51) Int. Cl.
| | |
|---|---|
| *F24S 25/63* | (2018.01) |
| *B65G 49/06* | (2006.01) |
| *F16B 2/10* | (2006.01) |
| *H01L 31/02* | (2006.01) |
| *H01L 31/048* | (2014.01) |
| *H02S 30/10* | (2014.01) |
| *F24S 25/10* | (2018.01) |
| *F16M 11/20* | (2006.01) |
| *F16M 11/42* | (2006.01) |

(52) U.S. Cl.
CPC ............ *F24S 25/63* (2018.05); *B65G 49/063* (2013.01); *B65G 49/067* (2013.01); *B65G 49/068* (2013.01); *F16B 2/10* (2013.01); *F16M 11/2085* (2013.01); *F24S 25/10* (2018.05); *H01L 31/02* (2013.01); *H01L 31/048* (2013.01); *H02S 30/10* (2014.12); *F16M 11/42* (2013.01); *Y02E 10/47* (2013.01); *Y10T 29/49826* (2015.01)

(58) Field of Classification Search
CPC ................................ B64C 3/26; B65G 47/904
USPC ..................................................... 269/56, 287
See application file for complete search history.

(56) References Cited

U.S. PATENT DOCUMENTS

| | | | | |
|---|---|---|---|---|
| 2,520,196 A | * | 8/1950 | Boone ................ | B65G 47/904 414/740 |
| 3,410,425 A | * | 11/1968 | Guillaume .......... | B65G 49/068 414/373 |

(Continued)

*Primary Examiner* — Jacob J Cigna
(74) *Attorney, Agent, or Firm* — Bryan Cave Leighton PaisnerLLP

(57) ABSTRACT

An apparatus for pre-assembly of an electrically connected array of solar panels for a solar canopy including a substantially planar base member for resting on a horizontal surface, a substantially planar support member for horizontally aligning side-by-side and horizontally supporting a plurality of solar panels and a support member extending upward from the base member; a track member disposed proximate a bottom portion of the support member attached to or integral with the support member or base member for vertically aligning side-by-side and vertically supporting a plurality of solar panels when a side edge portion of the solar panels rests on the track member; and at least two arm members pivotally attached proximate to opposing ends of the base member or support member.

10 Claims, 16 Drawing Sheets

Related U.S. Application Data application No. 13/112,314, filed on May 20, 2011, now Pat. No. 8,584,338.

(60) Provisional application No. 61/347,523, filed on May 24, 2010.

(56) References Cited

U.S. PATENT DOCUMENTS

| | | | |
|---|---|---|---|
| 3,517,834 A * | 6/1970 | Adams | E04G 21/14 414/787 |
| 3,751,794 A * | 8/1973 | Kay | E04B 1/49 100/913 |
| 3,811,578 A * | 5/1974 | Jureit | B65G 57/28 198/412 |
| RE28,609 E | 11/1975 | Malburet | |
| 3,946,876 A | 3/1976 | Jay | |
| 3,984,010 A * | 10/1976 | Woloveke | B65G 57/28 414/787 |
| 4,189,818 A * | 2/1980 | Lavoisey | B65G 49/067 29/281.5 |
| 4,372,027 A | 2/1983 | Hutchinson | |
| 4,383,680 A * | 5/1983 | Braceland | B25B 11/02 269/43 |
| 4,403,388 A * | 9/1983 | Belcher | B27M 3/0073 227/40 |
| 4,423,719 A | 3/1984 | Hutchinson | |
| 4,492,016 A * | 1/1985 | Smets | B27M 3/0073 227/104 |
| 4,623,083 A * | 11/1986 | Pagano | B27M 3/0073 227/152 |
| 4,829,651 A * | 5/1989 | Shirai | B27M 3/0073 227/103 |
| 5,233,931 A | 8/1993 | McCorkle, Jr. | |
| 5,433,259 A | 7/1995 | Faludy | |
| 5,620,293 A * | 4/1997 | Alarcon-Lopez | B65G 49/068 414/399 |
| 6,111,189 A | 8/2000 | Garvison et al. | |
| 6,499,206 B1 * | 12/2002 | Eure | B27M 3/0073 227/110 |
| 6,553,653 B2 | 4/2003 | Hulings et al. | |
| 6,559,371 B2 | 5/2003 | Shingleton et al. | |
| 6,659,265 B2 | 12/2003 | Pfeilschifter et al. | |
| 6,757,956 B2 * | 7/2004 | Koch | A47C 23/00 269/40 |
| 6,969,054 B2 * | 11/2005 | Sueme | B65G 47/082 269/13 |
| 7,217,077 B2 | 5/2007 | Mercure | |
| 7,487,771 B1 | 2/2009 | Eiffert et al. | |
| 7,658,055 B1 | 2/2010 | Adriani et al. | |
| 7,766,292 B2 | 8/2010 | Liebendorfer | |
| 7,856,769 B2 | 12/2010 | Plaisted et al. | |
| 8,156,697 B2 | 4/2012 | Miros et al. | |
| 8,316,590 B2 | 11/2012 | Cusson | |
| 8,328,020 B2 | 12/2012 | Flossmann | |
| 8,844,719 B2 | 9/2014 | Yoshida | |
| 8,850,754 B2 | 10/2014 | Rizzo | |
| 8,991,602 B2 | 3/2015 | Kashima et al. | |
| 9,130,088 B2 | 9/2015 | Croft et al. | |
| 2003/0070368 A1 | 4/2003 | Shingleton | |
| 2006/0005875 A1 | 1/2006 | Haberlein | |
| 2006/0219547 A1 | 10/2006 | Tuttle | |
| 2008/0029148 A1 | 2/2008 | Thompson | |
| 2008/0230047 A1 | 9/2008 | Shugar et al. | |
| 2009/0230265 A1 | 9/2009 | Newman et al. | |
| 2010/0018571 A1 | 1/2010 | Placer | |
| 2010/0071755 A1 | 3/2010 | Kruse | |
| 2010/0077592 A1 | 4/2010 | Casano | |
| 2010/0108118 A1 | 5/2010 | Luch | |
| 2010/0132769 A1 | 6/2010 | Potter et al. | |
| 2010/0163015 A1 | 7/2010 | Potter et al. | |
| 2010/0212714 A1 | 8/2010 | Rothschild et al. | |
| 2010/0218441 A1 | 9/2010 | Stancel et al. | |
| 2010/0236183 A1 | 9/2010 | Cusson et al. | |
| 2010/0237029 A1 | 9/2010 | Cusson et al. | |
| 2010/0258158 A1 | 10/2010 | Kuster et al. | |
| 2010/0294340 A1 | 11/2010 | Cunningham et al. | |
| 2011/0047931 A1 | 3/2011 | Wallgren | |
| 2011/0108093 A1 | 5/2011 | Hessler et al. | |
| 2011/0108498 A1 | 5/2011 | Haeberlein | |
| 2011/0229298 A1 | 9/2011 | Stancel et al. | |
| 2012/0027550 A1 | 2/2012 | Bellacicco et al. | |
| 2012/0031787 A1 | 2/2012 | McColl et al. | |
| 2012/0048350 A1 | 3/2012 | Gonzalez | |
| 2012/0082537 A1 | 4/2012 | Yoshida | |
| 2012/0163954 A1 | 6/2012 | Yoshida | |
| 2012/0174967 A1 | 7/2012 | Pearce et al. | |
| 2012/0222372 A1 | 9/2012 | Hilber | |
| 2012/0305444 A1 | 12/2012 | Fujita et al. | |
| 2013/0133723 A1 | 5/2013 | Croft et al. | |
| 2013/0270332 A1 | 10/2013 | Kuo | |
| 2013/0327669 A1 | 12/2013 | Sueoka et al. | |
| 2013/0334397 A1 | 12/2013 | Kashima et al. | |
| 2014/0076383 A1 | 3/2014 | Potter | |
| 2014/0360552 A1 | 12/2014 | Britcher et al. | |
| 2014/0367305 A1 | 12/2014 | Mizou et al. | |

* cited by examiner

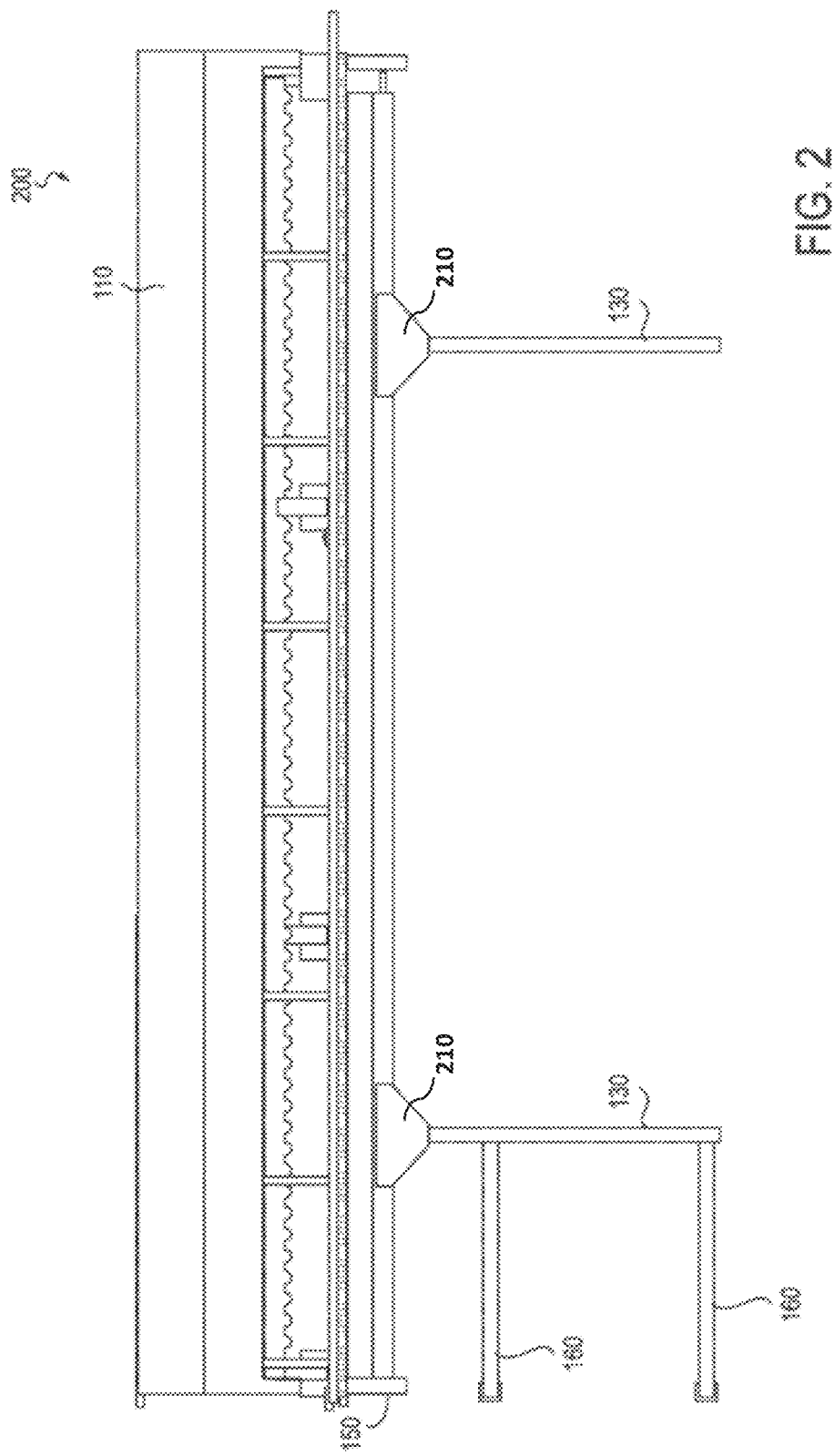

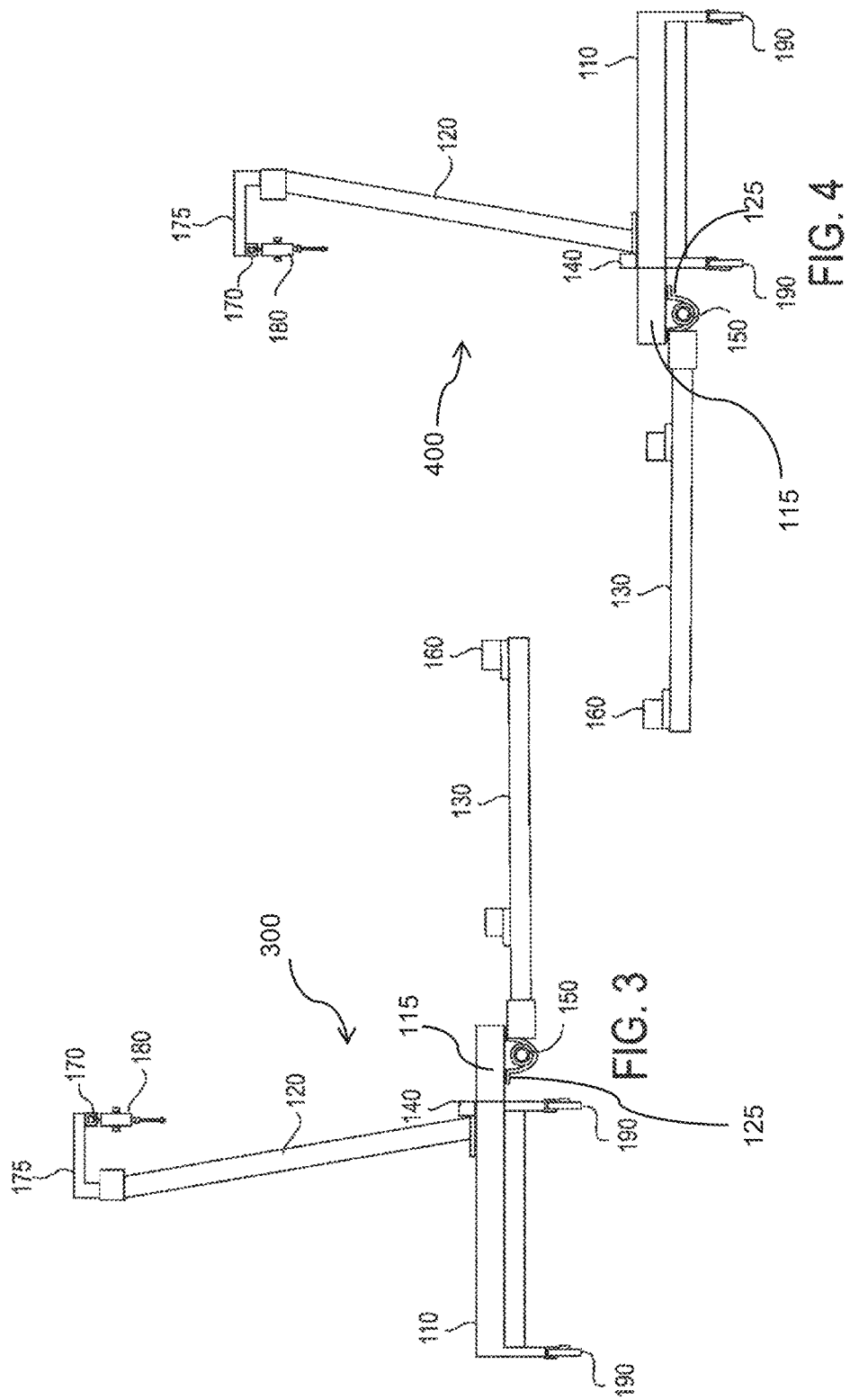

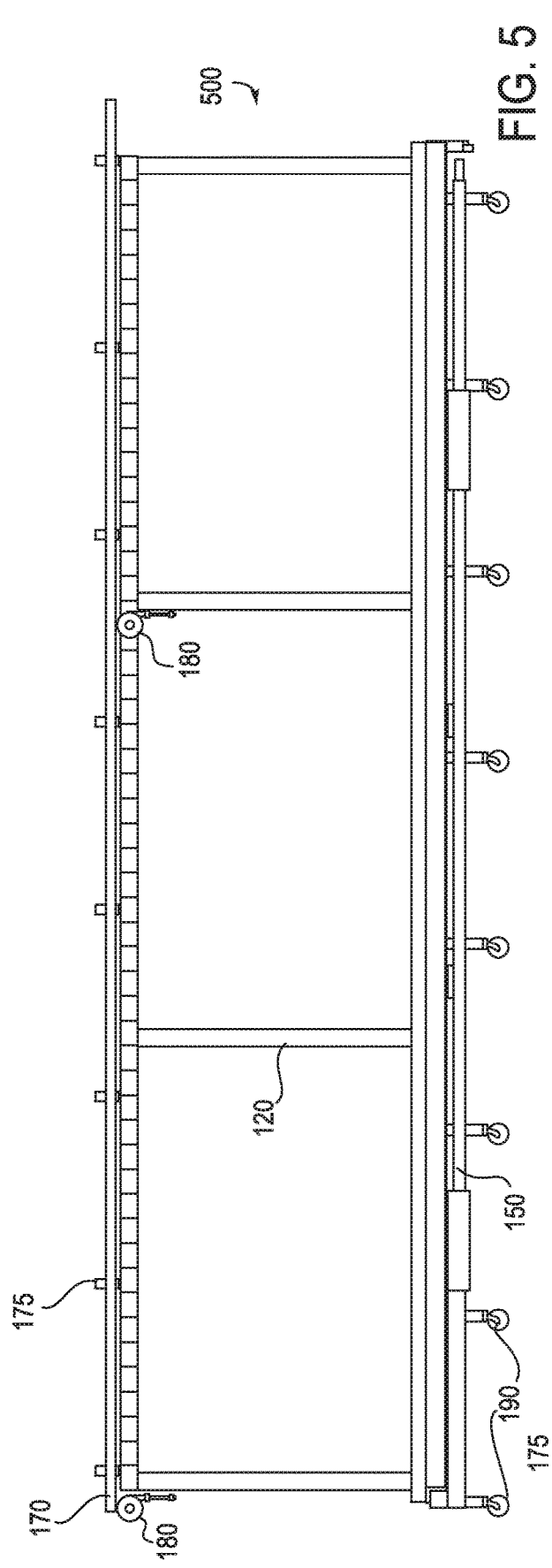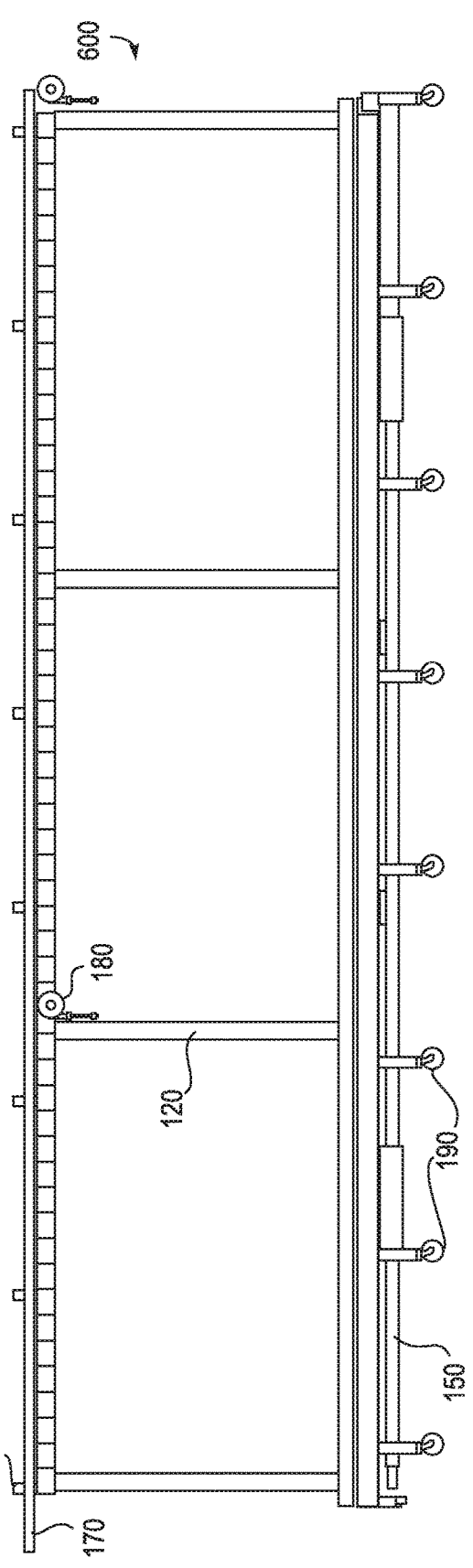

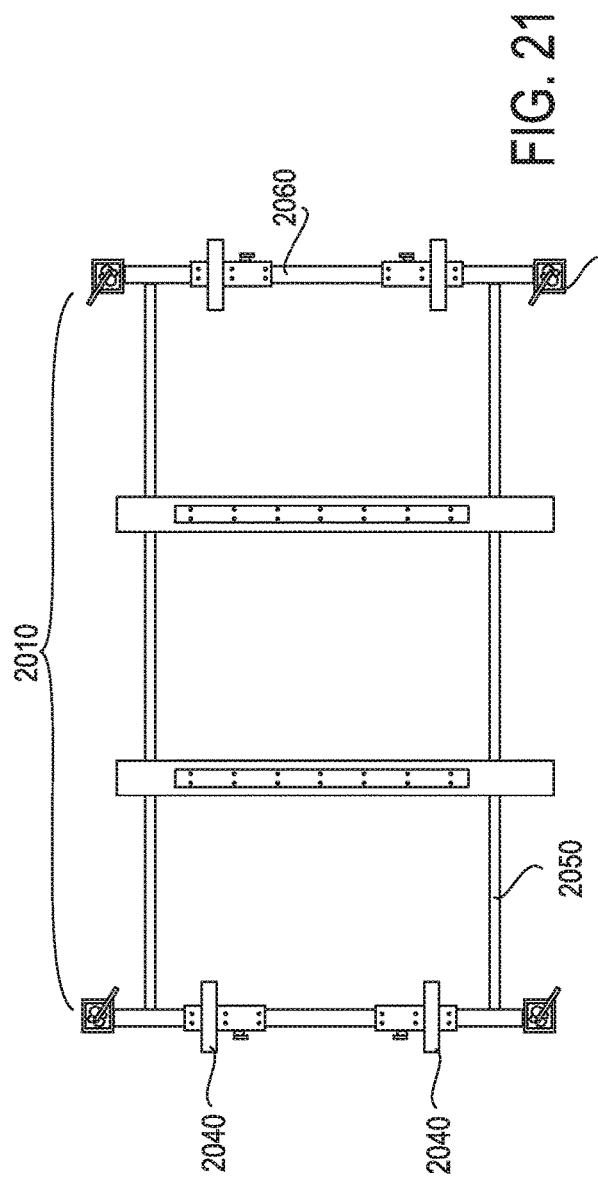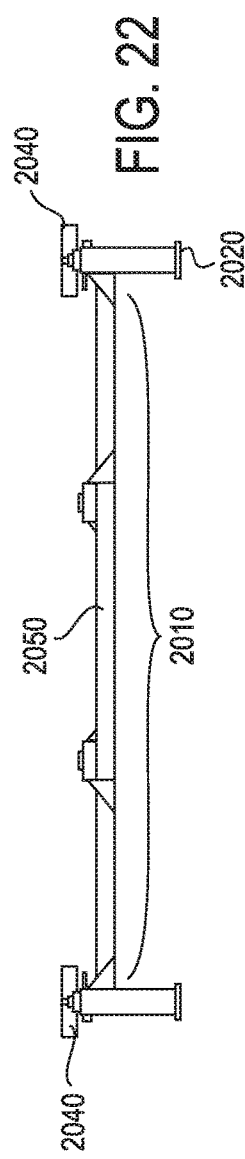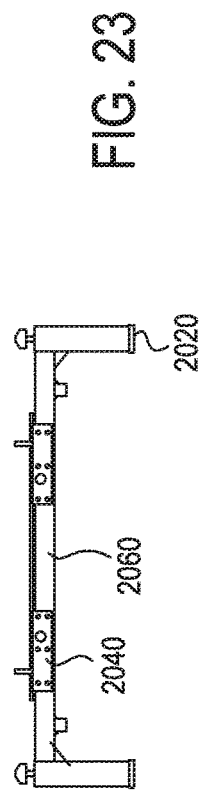

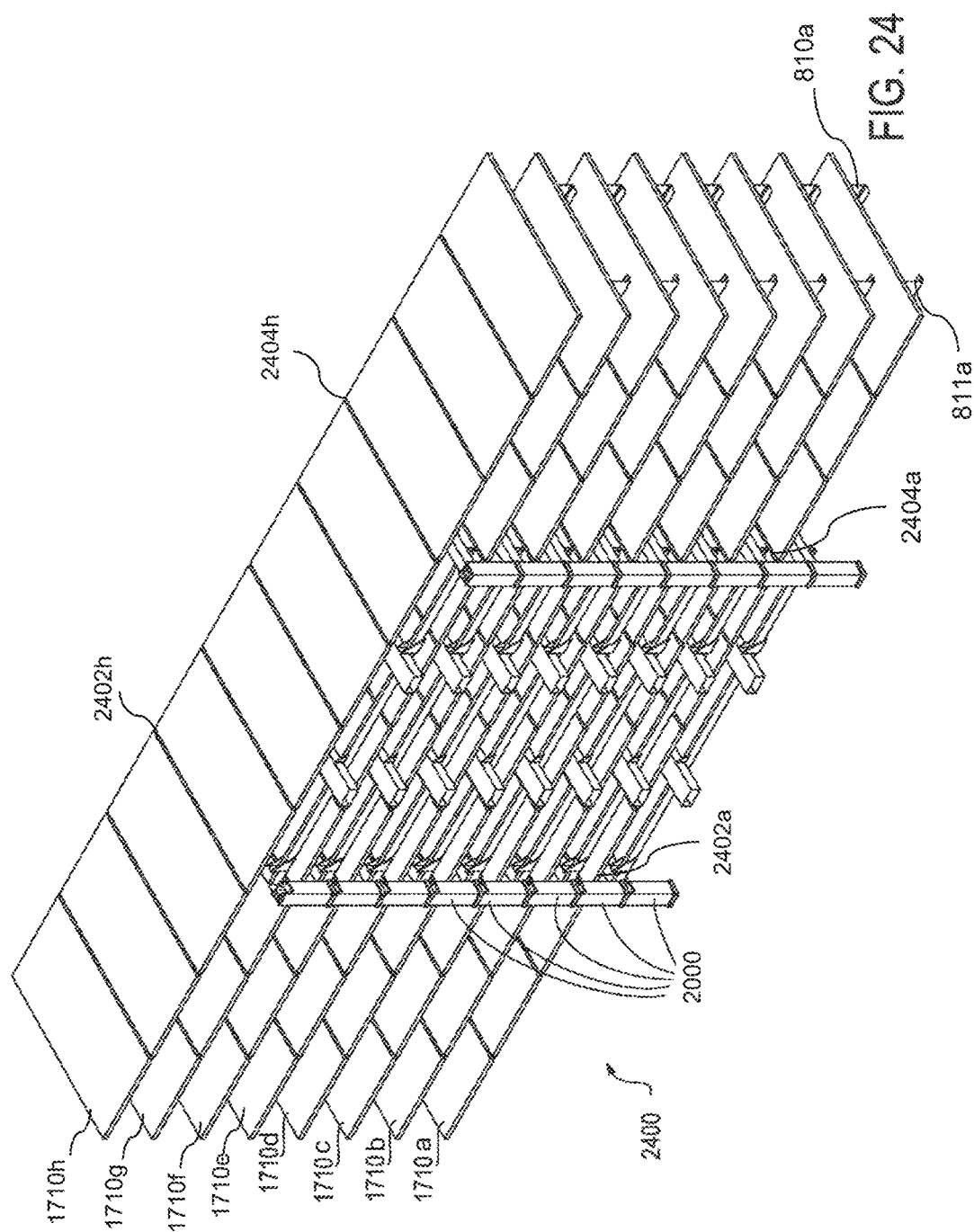

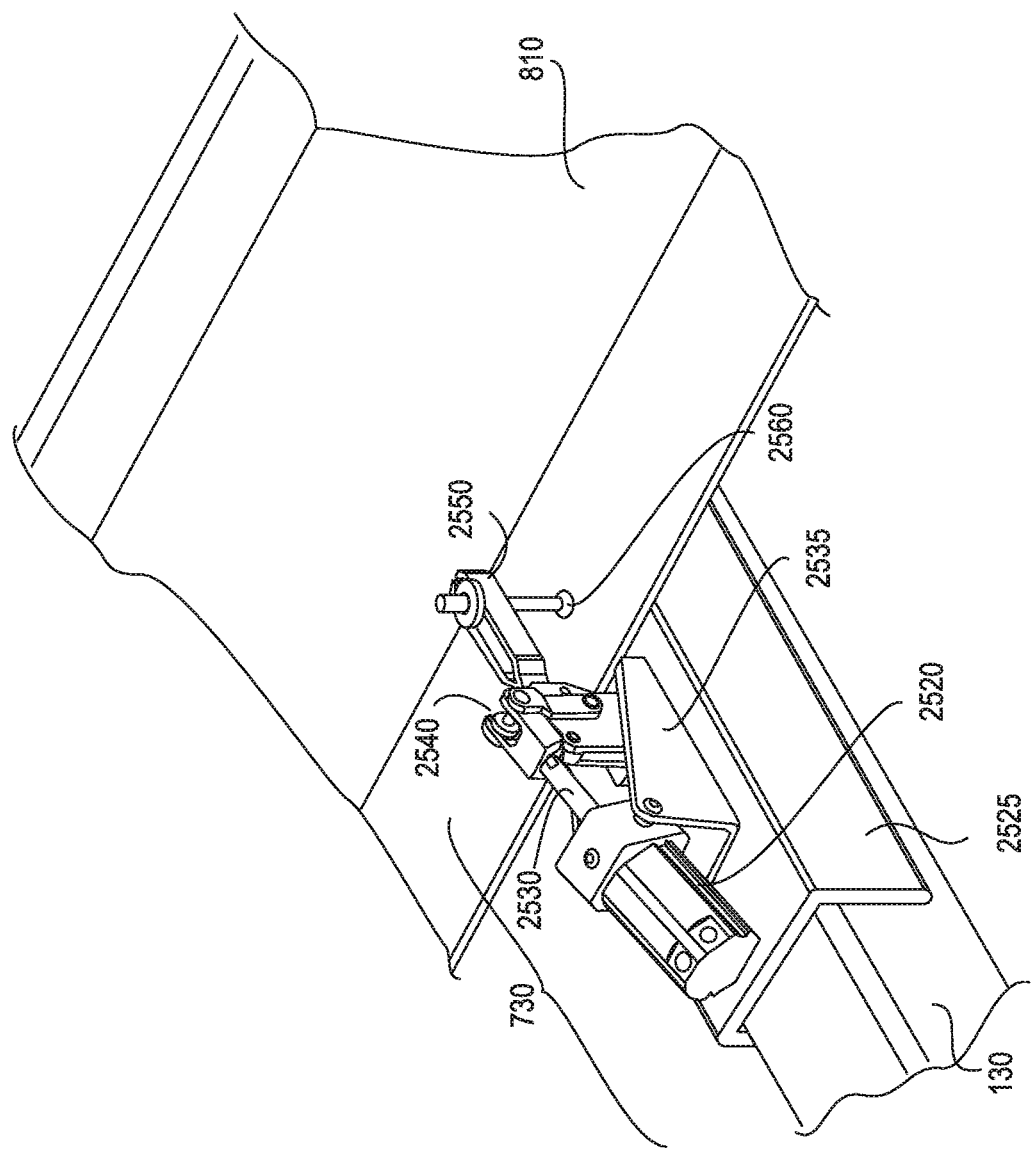

SOLAR MODULE ARRAY PRE-ASSEMBLY METHOD AND APPARATUS

CROSS-REFERENCE TO RELATED APPLICATIONS

This application claims priority from U.S. application Ser. No. 13/112,314 filed on May 20, 2011 and U.S. Provisional Application 61/347,523 filed on May 24, 2010, the contents of which are incorporated by reference in its entirety.

COPYRIGHT NOTICE AND AUTHORIZATION

This patent document contains material which is subject to copyright protection.

© Copyright 2010-2013. Chevron Energy Solutions Company, a division of Chevron U.S.A. Inc. All rights reserved.

With respect to this material which is subject to copyright protection. The owner, Chevron Energy Solutions Company has no objection to the facsimile reproduction by any one of the patent disclosure, as it appears in the Patent and Trademark Office patent files or records of any country, but otherwise reserves all rights whatsoever.

FIELD OF THE INVENTION

This invention relates an apparatus and method for pre-assembly of certain components of a solar canopy.

BACKGROUND OF THE INVENTION

Solar energy is a clean, renewal energy source. Photo-electro voltaic cell technology is increasing rapidly and makes installation of solar collector panels housing the photo-electro voltaic cells more and more economically feasible. Beyond the photo-electro voltaic cell technology itself are the problems of placement and support of the solar collector panels. Large numbers of solar collector panels must be assembled in series to achieve useful power production. In remote areas these may be placed on the ground without interfering with land use. In more developed areas, it is desirable to place the solar collector panels such that the land may also be used for other purposes, e.g., for parking lots, school/office hallways, playgrounds, or sports fields. To achieve this requires an elevated structure to support the solar collector panels.

In prior known systems, installation costs amount to around 25% of the overall cost of a solar parking shade installation. These installation cost includes the cost to place modules on a rack, wire the modules together and to a combiner box, bolt the modules in place, and place the support structure on a parking shade structure. These costs often amount to almost the actual panel cost themselves due to the lack of ability to achieve assembly efficiency as well as the need in governmental markets to use union labor.

An additional deficiency in known methods/systems for solar canopy installation is that the size of solar modules used is limited to the size module a contractor can physically carry. The installation process is also cumbersome and dangerous due to work on nonstandard sites and at an elevated height.

It is desirable to have a method and system which overcomes the deficiencies of known systems. The instant invention provides such a solution.

SUMMARY OF THE INVENTION

The invention in one embodiment includes an apparatus for pre-assembly of an electrically connected array of solar panels for a solar canopy comprising:

(a) a support member for aligning side-by-side a plurality of solar panels with a bottom portion of the solar panels exposed; and (b) an arm member attached at one longitudinal end portion proximate to the side portion of the support member and configured and adapted for removably attaching at least two solar panel support channels.

The invention in another embodiment includes an apparatus for pre-assembly of an electrically connected array of solar panels for a solar canopy comprising:

(a) a base member horizontally disposed for supporting other elements;

(b) a support member having attached along one side portion of the support member to the base member and an opposing side portion disposed away from the base member for aligning side-by-side a plurality of solar panels with a bottom portion of the solar panels exposed; and (c) an arm member attached at one longitudinal end portion proximate to the side portion of the support member attached to the base member and configured and adapted for removably attaching at least two solar panel support channels.

The invention in another embodiment includes an an apparatus for pre-assembly of an electrically connected array of solar panels for a solar canopy comprising:

(a) a substantially planar base member for resting on a horizontal surface, (b) a substantially planar support member for horizontally aligning side-by-side and horizontally supporting a plurality of solar panels when a photo-voltaic cell side of the solar panels rests against the support member, wherein a bottom portion of the support member is integral with the base member or fixed attached to the base member, and the support member extends upward from the planar base member;

(c) a track member disposed proximate a bottom portion of the support member attached to or integral with the support member or base member for vertically aligning side-by-side and vertically supporting a plurality of solar panels when a side edge portion of the solar panels rests on the track member; and (d) at least two arm members, each having a free end and an attached end, the attached ends pivotally attached proximate to opposing ends of the base member or support member and each arm members having a longitudinal axis oriented substantially perpendicular to the longitudinal axis of the base member and support member and extending outward from the base member and support member, and configured to pivot in a vertical plane from a position substantially parallel to the ground upward to a position substantially parallel to the plane of the support member, wherein upon pivoting in one direction the free end moves closer towards the support member and pivoting in the other direction the free end moves away from the support member, the arm members being configured and adapted for removably attaching at least two solar panel support channels.

In another embodiment the invention includes a method for pre-assembly of an electrically connected array of solar panels for a solar canopy, the method comprising:

The invention in another embodiment includes a method for pre-assembly of an electrically connected array of solar panels for a solar canopy, the method comprising:

(a) aligning a plurality of solar panels side-by-side in an electrically connected array of solar panels pre-assembly apparatus, the pre-assembly apparatus comprising:

a base member for resting on a horizontal surface;

a support member for horizontally aligning side-by-side and horizontally supporting a plurality of solar panels when a photo-voltaic cell side of the solar panels rests against the support member, wherein a bottom portion of the support member is integral with the base member or fixed attached to the base member, and the support member extends upward from the base member;

a track member disposed proximate a bottom portion of the support member attached to or integral with the support member or base member for vertically aligning side-by-side and vertically supporting a plurality of solar panels when a side edge portion of the solar panels rests on the track member; and at least two arm members, each having a free end and an attached end, the attached ends pivotally attached proximate to opposing ends of the base member or support member and each arm members having a longitudinal axis oriented substantially perpendicular to the longitudinal axis of the base member and support member and extending outward from the base member and support member, and configured to pivot in a vertical plane from a position substantially parallel to the ground upward to a position substantially parallel to the plane of the support member, wherein upon pivoting in one direction the free end moves closer towards the support member and pivoting in the other direction the free end moves away from the support member, the arm members being configured and adapted for removably attaching at least two solar panel support channels;

wherein a bottom portion of the plurality of solar panels is supported by the track member and a front portion is supported by the support member, facing inward towards the base member;

(b) removably attaching at least two solar panel support channels to the arm members of the solar panel array pre-assembly apparatus, wherein the longitudinal axis of the solar panel support channels is parallel to the longitudinal axis of the base member and positioned to contact a bottom portion of all of the plurality of solar panels, near opposite longitudinal ends of each of the plurality of solar panels when the arm members are rotated about the longitudinal axis of the base member where attached;

(c) manipulating the position of the arm members of the electrically connected array of solar panels pre-assembly apparatus relative to position of the support member of the electrically connected array of pre-assembly apparatus such that the solar panel support channels contacts a bottom portion of all of the plurality of solar panels, near opposite longitudinal ends of each of the plurality of solar panels, thereby aligning the solar panel support channels for attachment to bottom of the plurality of solar panels;

(d) fixedly attaching a top portion of the solar panel support channels to a bottom portion of each of the plurality of solar panels; and (e) reversing the manipulation in step (c) of the position of the arm members of the solar panel array pre-assembly apparatus relative to position of the support member of the pre-assembly apparatus, such that the plurality of solar panels and attached solar panel support channels lay parallel with the ground surface and are ready to be loaded on a truck for transportation to the job site.

These and other features and advantages of the present invention will be made more apparent through a consideration of the following detailed description of preferred embodiments of the invention. In the course of this description, frequent reference will be made to the attached drawings.

BRIEF DESCRIPTION OF THE DRAWINGS

FIG. 2 is a top view of one embodiment of the present invention.

FIG. 3 is a side view in one embodiment of the present invention.

FIG. 4 is an opposite side view in one embodiment of the present invention.

FIG. 5 is a front view of one embodiment of the present invention.

FIG. 6 is a back view of one embodiment of the present invention.

FIG. 21 is a top view of one embodiment of the pallet structure of the present invention.

FIG. 22 is a side view of one embodiment of the pallet structure of the present invention.

FIG. 23 is an end view of one embodiment of the pallet structure of the present invention.

FIG. 24 is a perspective view of one embodiment of multiple stacked pallet structures of the present invention with completed Zee-channels attached to a plurality of solar panels loaded on each pallet structure.

FIG. 26 is an alternate perspective view of one embodiment of the clamp structure of the present invention.

DETAILED DESCRIPTION OF PREFERRED EMBODIMENTS

Other embodiments of the present invention and its individual components will become readily apparent to those skilled in the art from the foregoing detailed description. As will be realized, the invention is capable of other and different embodiments, and its several details are capable of modifications in various obvious respects, all without departing from the spirit and the scope of the present invention. Accordingly, the drawings and detailed description are to be regarded as illustrative in nature and not as restrictive. It is therefore not intended that the invention be limited except as indicated by the appended claims.

As used in this specification and claims, the "solar panel support channels" comprise "Z"-shaped sheet metal, also referred to as "Zee-channels" or "Z-channels", "C"-shaped sheet metal, also referred to as "Cee-channels" or "c-channels", or standard beams, bars, and other suitable support members.

Figure 1:
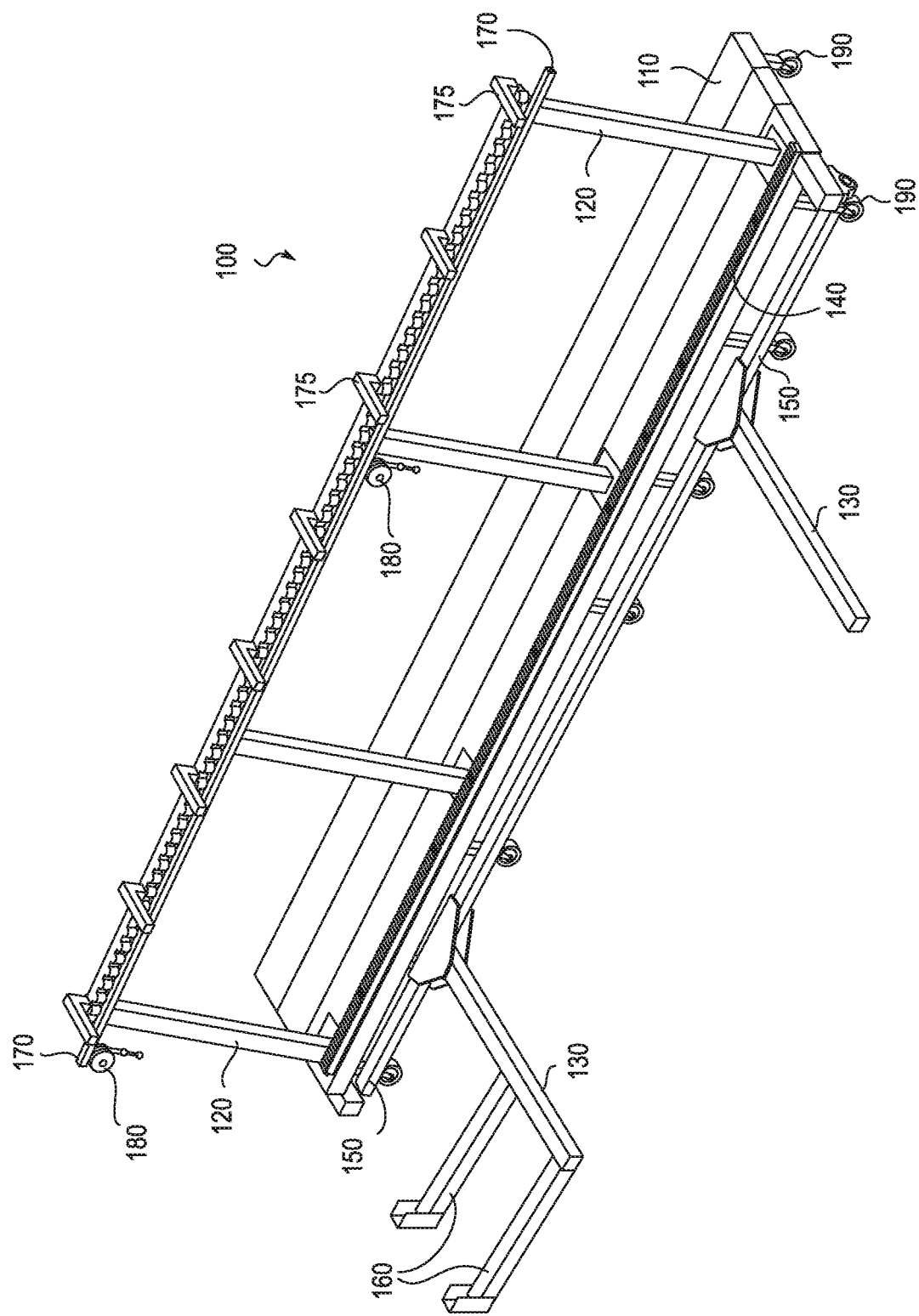
FIG. 1 is a perspective view of one embodiment of the present invention.

FIG. 1 is a perspective view of one embodiment of the present invention. The invention includes an apparatus 100 for pre-assembly of an electrically connected array of solar panels for a solar canopy. Base member 110 (having longitudinal and lateral side portions) is for resting on any solid stable horizontal surface capable of supporting the weight of the apparatus, workers, and solar panels to be assembled. In one embodiment the base member 110 is substantially planar. Optionally, wheels 190 are attached at the bottom of base member 110 to allow repositioning of the apparatus 100. In another embodiment (not shown) there is no base member 110 and instead support member 120 is self-supporting or supported, e.g., by attachment to a wall, floor or other fixture, or by placement of "post" legs at the bottom of the support member into "post" holes in the floor. In another embodiment the support member 120 is self supporting due to its shape, e.g., box-shaped or triangle shaped.

A support member 120 is fixedly or removably attached to base member 110 and is for horizontally aligning side-by-side and horizontally supporting a plurality of solar panels when a photo-voltaic cell side of the solar panels rests against the support member 120. In one embodiment the support member 120 is substantially planar. A bottom portion of support member 120 is integral with the base member or fixed attached to the base member 110, and the support member 120 extends upward from the base member 110. The support member 120 is inclined from vertical sufficiently for supporting the solar panels. In one embodiment the support member 120 is inclined from about 3 degrees to about 25 degrees from vertical. Optionally, support member 120 is comprised of a lattice framework. A solid form is another option, e.g. molded plastic or forged metal.

A track member 140 is disposed proximate a bottom portion of the support member 120 and is attached to or integral with the support member 120 or base member 110 for vertically aligning side-by-side and vertically supporting a plurality of solar panels when a side edge portion of the solar panels rests on the track member 140. At least two arm members 130, each having a free end and an attached end, the attached ends pivotally attached proximate to opposing ends of the base member 110 or support member 120. In this embodiment one end of arm members 130 is attached to pivot bar 150 (also referred to as shaft member) and the opposing ends of pivot bar 150 are attached to brackets on opposing ends of base member 110. Each arm members 130 having a longitudinal axis oriented substantially perpendicular to the longitudinal axis of the base member 110 and pivot bar 150 and extend outward from the base member 110. The arm members 130 are configured to pivot in a vertical plane from a position substantially parallel to the ground upward to a position substantially parallel to the plane of the support member 120.

Upon pivoting in one direction the free end of the arm members 130 moves closer towards the support member 120 and pivoting in the other direction the free end of the arm members 130 moves away from the support member 120. The arm members 130 are configured and adapted for removably attaching at least two solar panel support channels (see FIGS. 13 and 14). Also, the arm members 130 in one embodiment are configured and adapted for removably attaching at least two solar panel support channels 810 (see FIG. 8) at multiple positions and spacing along the longitudinal axis of arm members 130 so as to be suitable for use with a plurality of solar panel sizes. In one embodiment arms 130 are movable and may be adjusted along pivot bar 150 for different size solar panel arrays. Also, in another embodiment arm members 130 may be folded towards and against pivot bar 150 to allow for more easy transportation of the apparatus 100.

Optionally, one or more alignment beams 160 are attached to one of the arm members 130. Alignment beams 160 have a free end and a fixed end where the fixed end is movably attached perpendicularly to an arm member 130 at one end of assembly 100 and extending away from other arm members 130, i.e., in longitudinal alignment with the base member 110. Alignment beams 160 are configured and adapted for aligning and preventing lateral movement of a solar panel support channels (see FIGS. 9 and 10), wherein the alignment beam is adjustable along the length of the arm member to suit various solar panel sizes. In another embodiment alignment beams 160 may be folded towards and against arm members 130 to allow for more easy transportation of the apparatus 100.

Optionally, a tool rail 170 is attached via tool rail support arms 175 to a top portion of support member 120 and is parallel to it. It is configured to receive a movable tool caddy 180 which can be slide along the tool rail 170 by a technician and has a hook, strap or other device for holding a tool such as an electric drill or riveter. The tool rail 170 and tool caddy 180 reduces the lifting and moving work of the technician of heavy tools.

FIG. 2 is a top view of one embodiment of the present invention 200. An additional optional element more clearly shown in this figure is brace members 210 which attach to arm members 130 and pivot bar 150 where the two are joined.

FIG. 3 is a side view in one embodiment of the present invention 300. More clearly shown in this figure is the track in tool rail 170 in which tool caddy 180 may slide. Also this side view more clearly shows one end of pivot bar 150 where it is rotatably attached to base member 110. More than one tool caddy 180 may be slid on tool rail 170, e.g., one for each technician working on the assembly.

FIG. 4 is an opposite side view in one embodiment of the present invention 400. FIGS. 3 and 4 show a base member protrusion 710 and "C" bracket 720 for securing each end of pivot bar 150.

FIG. 5 is a front view of one embodiment of the present invention 500. This view more clearly shows a plurality of optional wheels 190 attached at the bottom of base member 110 to allow easy relocation of the apparatus 500.

FIG. 6 is a back view of one embodiment of the present invention 600.

Figure 7:
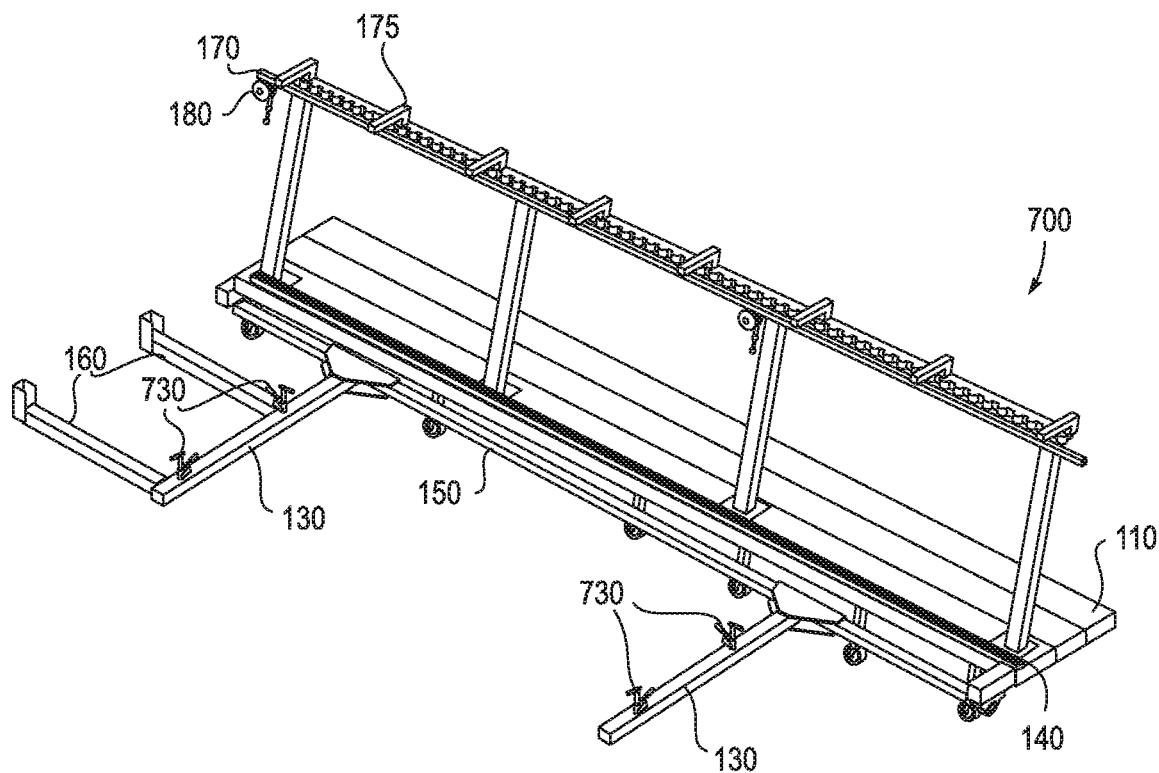
FIG. 7 is a perspective view of one embodiment of the present invention with emphasis on depicting the arm members for supporting Zee-channels or C-channels.

FIG. 7 is a perspective view of one embodiment of the present invention 700 with emphasis on depicting the arm members 130 for supporting Zee-channels or C-channels. Also this figure depicts clamp member 730 attached to arm members 130 for removably attaching, e.g., a Zee-channel (shown in FIG. 8). For each Zee-channel used in the assembly of a solar module array there are at least two corresponding clamp members 730, i.e., one for attaching the Zee-channel to each of the preferably at least two arm members 130. Any known clamping structure may be used, e.g., screw-down clamp, magnetic clamp, bar and clasp clamp, bar and lock clamp, to hold the Zee-channel during assembly and to release the solar module array at the Zee-channel after assembly is completed.

The clamp members 730 are preferably attached to respective arm members 130 at equal distances from the pivot bar 150 so as to allow attaching the Zee-channels parallel to the longitudinal access of the base member 110. Where optional alignment beams 160 are attached to arm members 130, the clamp members are positioned so that when a Zee-channel is attached via a clamp member 730 one end of the Zee-channel rests along the alignment beam 160 and abuts its end portion, thus easily positioning the Zee-channel for attachment to the bottom of solar panels (see FIGS. 13 and 14).

Figure 8:
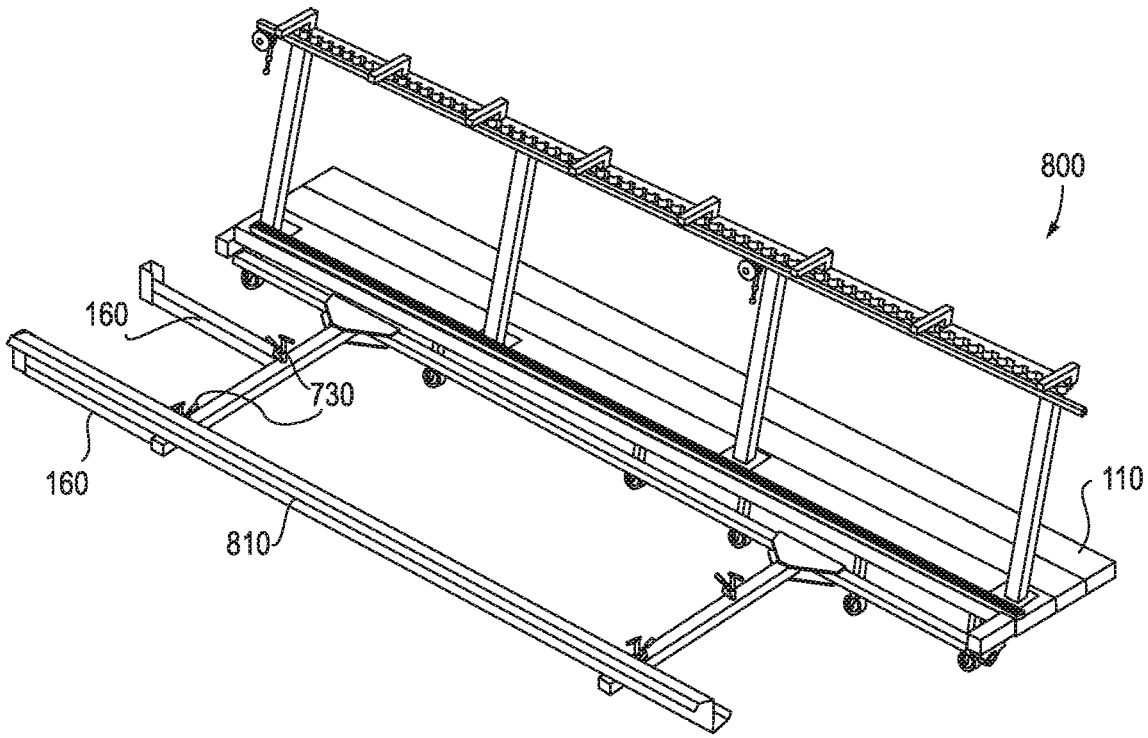
FIG. 8 is a perspective view of one embodiment of the present invention depicting one Zee-channel attached to the arm members.

FIG. 8 is a perspective view of one embodiment of the present invention 800 depicting one Zee-channel 810 attached via clamp members 730 to the arm members 130. One end of the Zee-channel 810 rests along the alignment beam 160 and abuts its end portion.

Figure 9:
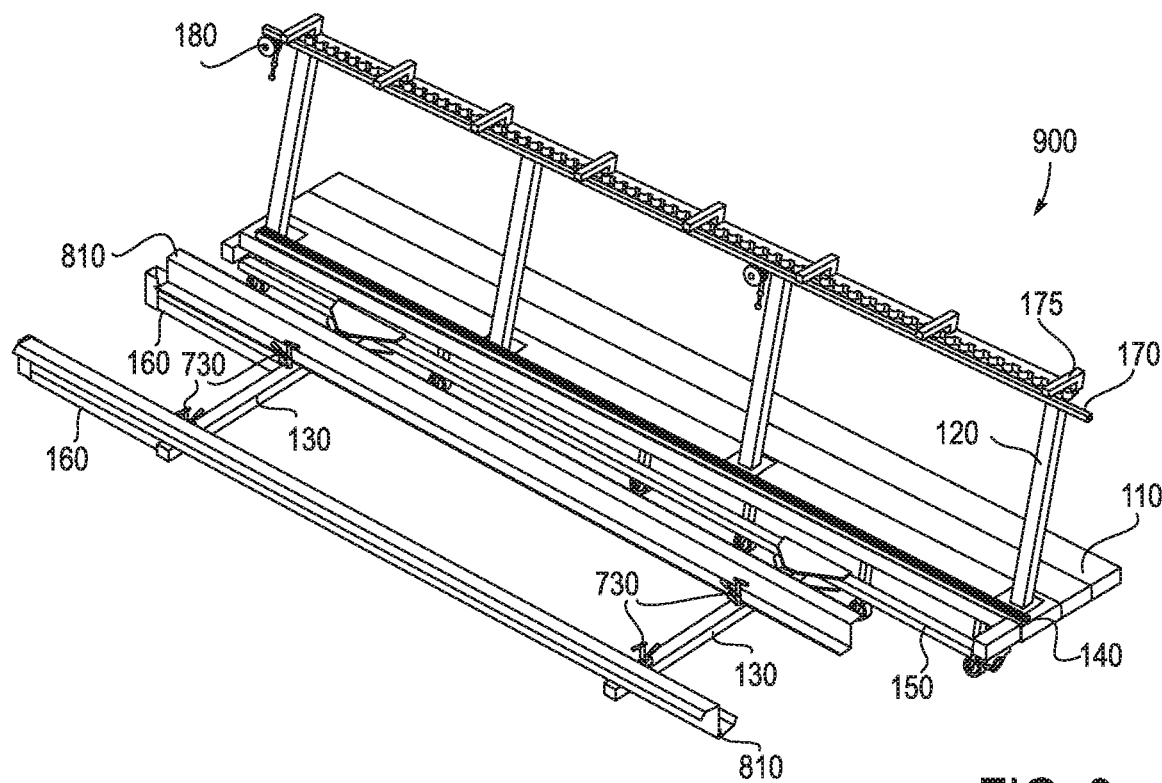
FIG. 9 is a perspective view of one embodiment of the present invention depicting two Zee-channels attached to the arm members.

FIG. 9 is a perspective view of one embodiment of the present invention 900 depicting two Zee-channels 810 attached to the arm members 130, both having one end resting along an alignment beam 160 and abutting an end portion of the alignment beam.

Figure 10:
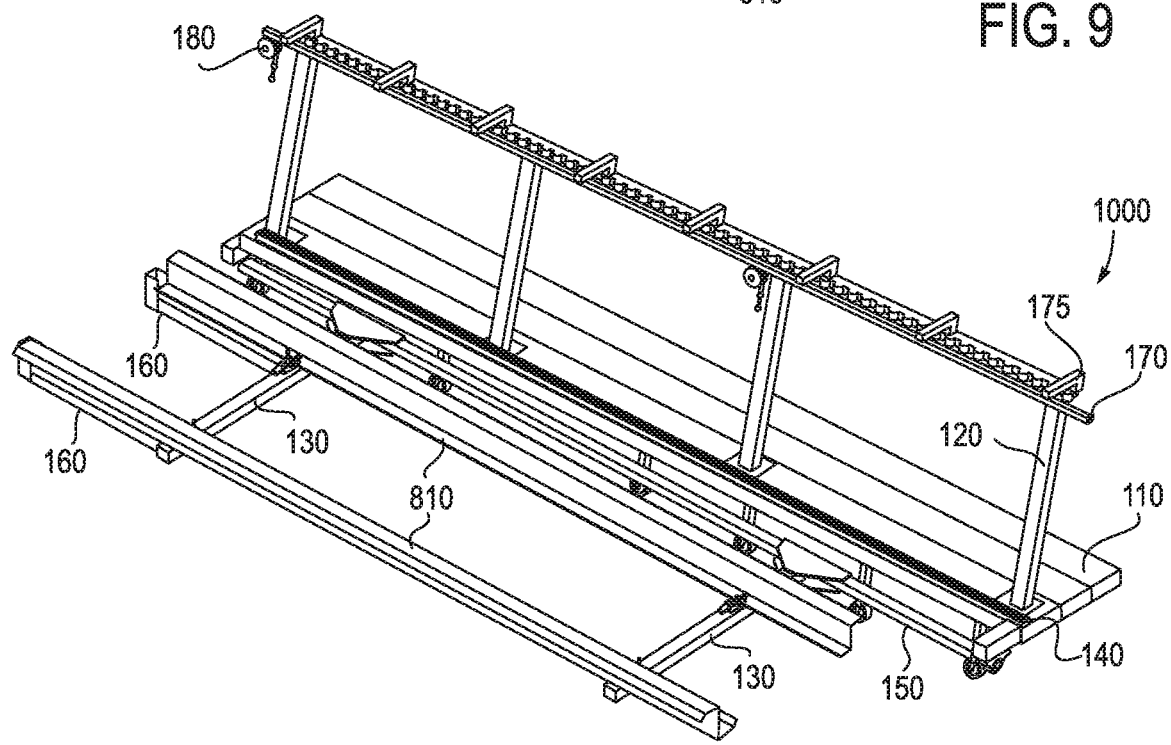
FIG. 10 is an alternate perspective view of one embodiment of the present invention depicting two Zee-channels attached to the arm members.

FIG. 10 is an alternate perspective view of one embodiment of the present invention 1000 depicting two Zee-channels 810 attached to the arm members 130, both having one end resting along an alignment beam 160 and abutting an end portion of the alignment beam.

Figure 11:
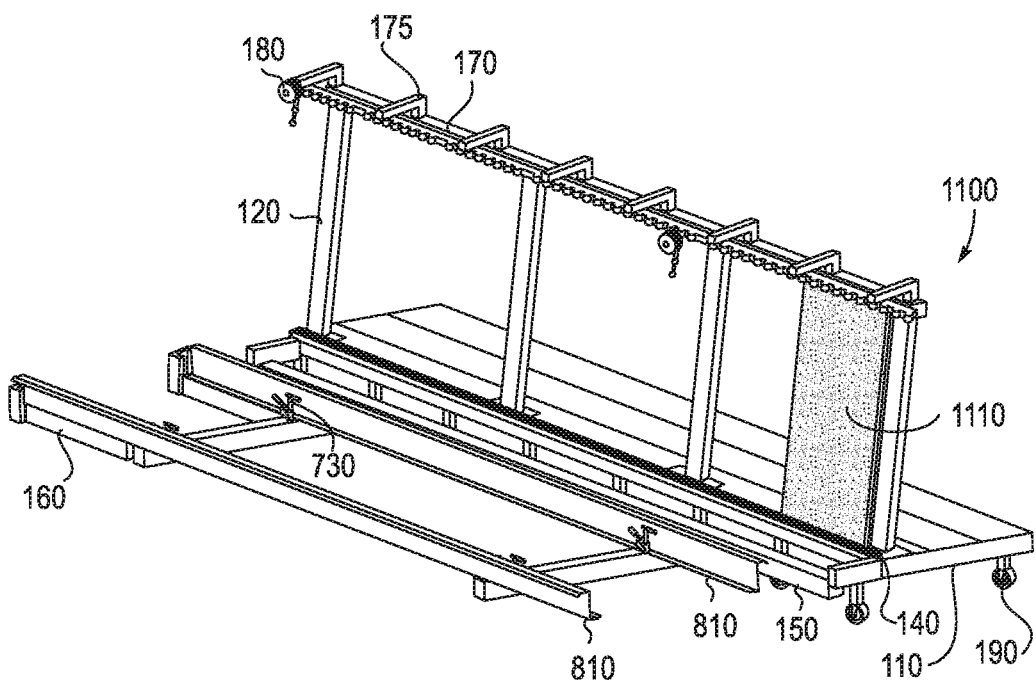
FIG. 11 is a perspective view of one embodiment of the present invention depicting two Zee-channels attached to the arm members and one solar panel resting in the track member.

FIG. 11 is a perspective view of one embodiment of the present invention 1100 depicting two Zee-channels 810 attached to the arm members and one solar panel 1110 resting in the track member 140. The solar panel 1110 has a bottom portion supported by resting in track member 140 and upper portion supported by leaning against support member 120.

Figure 12:
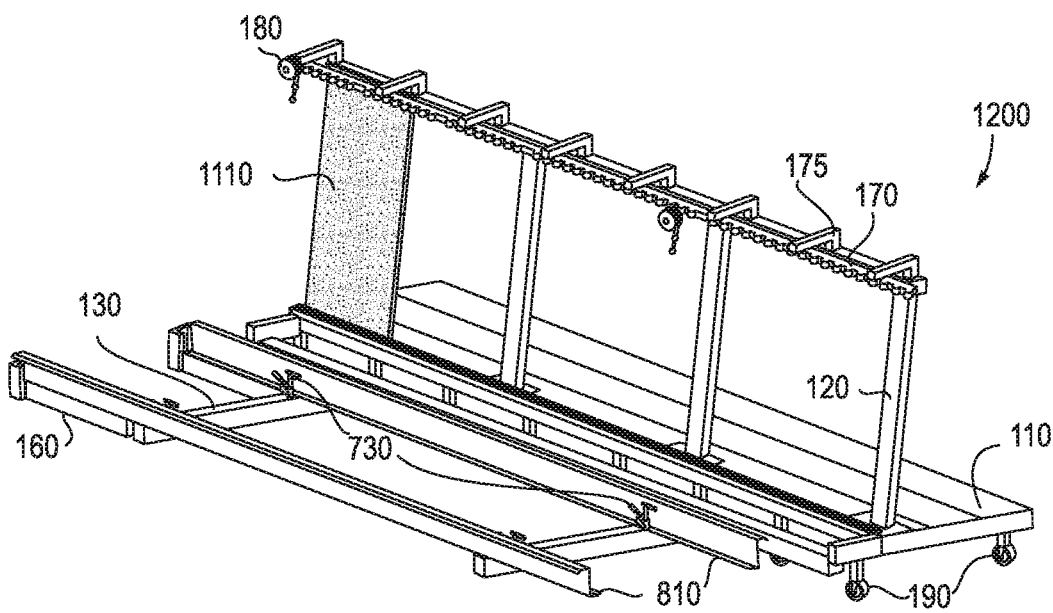
FIG. 12 is a perspective view of one embodiment of the present invention depicting two Zee-channels attached to the arm members and one solar panel resting in the opposite end of the track member.

FIG. 12 is a perspective view of one embodiment of the present invention 1200 depicting two Zee-channels attached to the arm members 130 and one solar panel 1110 resting in the opposite end of the track member 140 from that shown in FIG. 11. This depicts one optional method of use of the apparatus 1200 where one end of the track member 140 and support member 120 is the "feed" end for feeding a plurality of solar panels onto the apparatus. This mode would be convenient where the supply of solar panels 1110 is stacked on that side of the apparatus. Then each solar panel is slide to the opposite end of the track member 140 and support member 120 and this is repeated until a sufficient number of solar panels have been placed on the apparatus. Alternately, solar panels 1110 could be feed from both ends of the track member 140 and support member 120, either alternately or simultaneously depending on available number of technicians and placement of solar panel stock.

Figure 13:
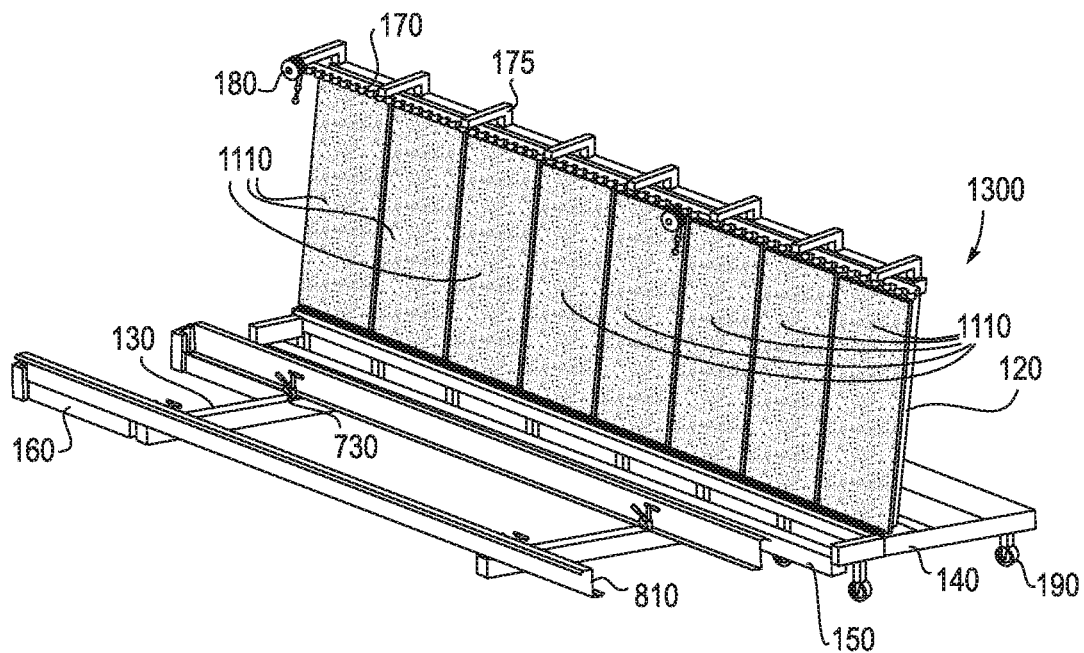
FIG. 13 is a perspective view of one embodiment of the present invention depicting two Zee-channels attached to the arm members and a plurality of solar panel resting in the track member.

FIG. 13 is a perspective view of one embodiment of the present invention 1300 depicting two Zee-channels 810 attached to the arm members 130 and a plurality of solar panels 1110 resting in the track member 140 and against support member 120. The plurality of solar panels is now positioned for attachment of the Zee-channels 810.

Figure 14:
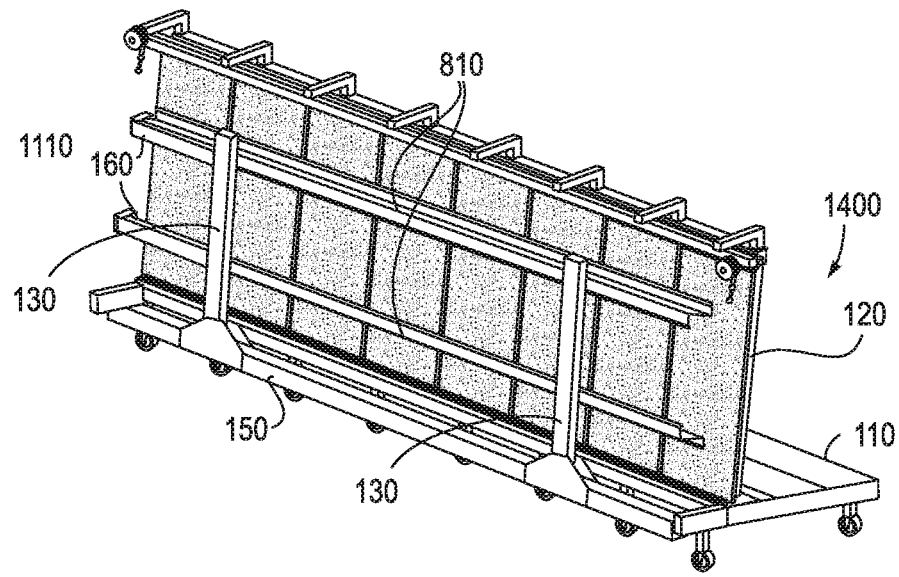
FIG. 14 is a perspective view of one embodiment of the present invention depicting two Zee-channels attached to the arm members and a plurality of solar panel resting in the track member, and the arm members partially folded/rotated upward towards the Zee-channels/support member.

FIG. 14 is a perspective view of one embodiment of the present invention 1400 depicting two Zee-channels 810 attached to the arm members 130 and a plurality of solar panels 1110 resting in the track member 140 and against support member 120, and the arm members 130 partially folded/rotated upward towards the support member 120.

Figure 15:
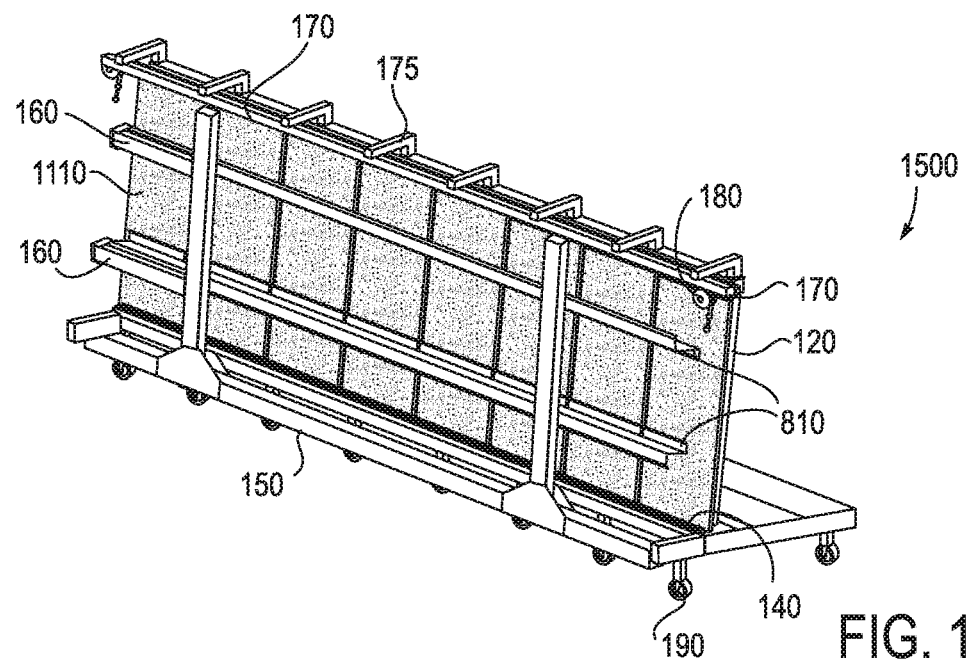
FIG. 15 is a perspective view of one embodiment of the present invention depicting two Zee-channels attached to the arm members and a plurality of solar panel resting in the track member, and the arm members fully folded/rotated upward towards the Zee-channels/support member, so as to place the Zee-channels in position to be attached to the plurality of solar panels.

FIG. 15 is a perspective view of one embodiment of the present invention 1500 depicting two Zee-channels 810 attached to the arm members 130 and a plurality of solar panels 1110 resting in the track member 140 and against support member 120, and the arm members 130 fully folded/rotated upward towards the support member 120 and bottom of solar panels 1110 and in contact with the bottom of solar panels 1110 and therefore positioned for attachment to the solar panels 1110 so as to place the Zee-channels 810 in position to be attached to the plurality of solar panels 1110. The positioning of the tool rail 170 is above the height of arm members 130 when fully folded so as not to interfere with their folding.

Figure 16:
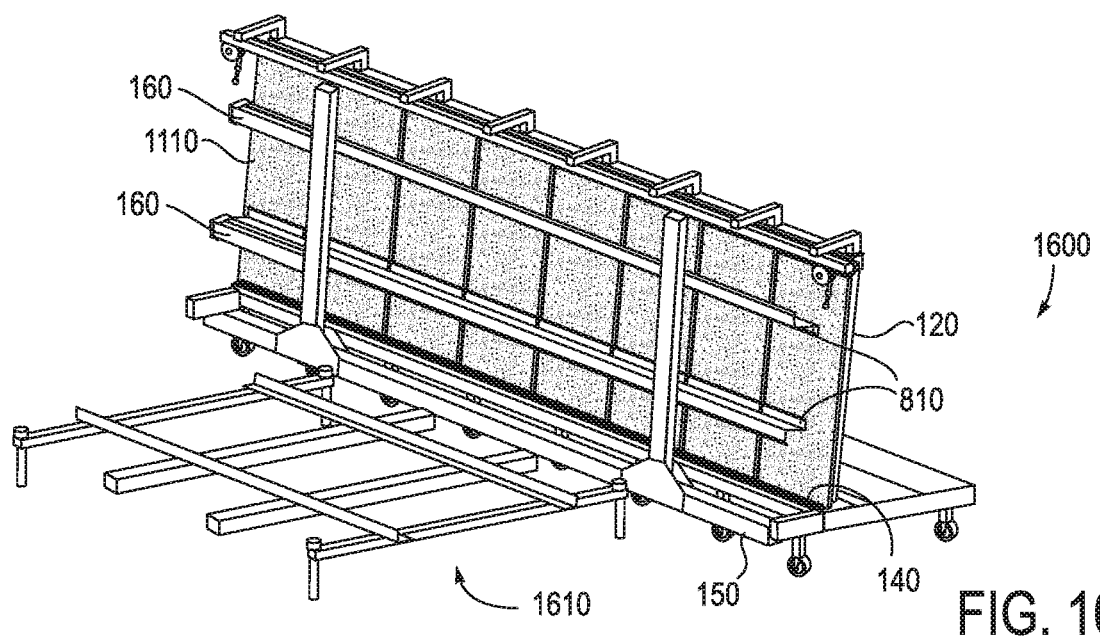
FIG. 16 is a perspective view of one embodiment of the present invention depicting two Zee-channels attached to the arm members and a plurality of solar panel resting in the track member, and the arm members fully folded/rotated upward towards the two Zee-channels/support member, with the Zee-channels attached to the plurality of solar panels, and a pallet structure in position to receive the two Zee-channels attached to the plurality of solar panels.

FIG. 16 is a perspective view of one embodiment of the present invention 1600 depicting two Zee-channels 810 attached to the arm members 130 and a plurality of solar panels 1110 resting in the track member 140, and the arm members 130 fully folded/rotated upward towards the two support member 120, with the Zee-channels 810 now attached to the plurality of solar panels 1110, and a pallet structure 1610 in position to receive the newly assembled solar module array 1710 (consisting of two Zee-channels 810 attached to the plurality of solar panels 1110). Optionally, the pallet structure 1610 is properly positioned to receive the solar module array 1710 by abutting one side of pallet structure 1610 against pivot bar 150.

Figure 17:
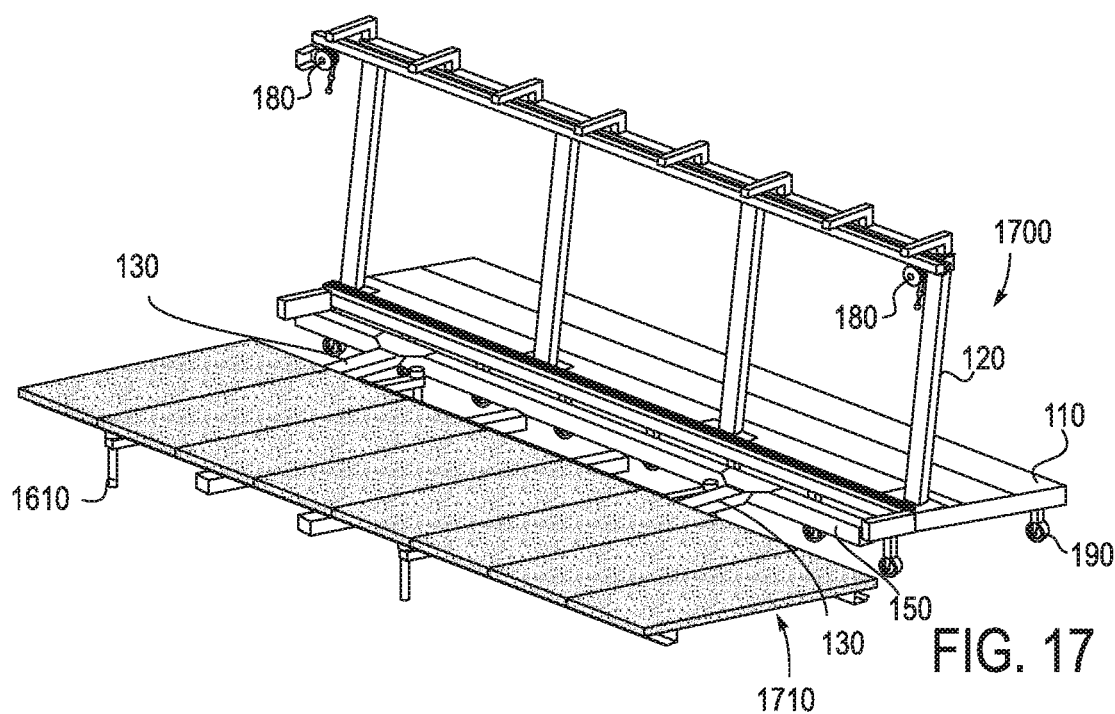
FIG. 17 is a perspective view of one embodiment of the present invention depicting the two Zee-channels attached to the plurality of solar panels and supported by the pallet structure.

FIG. 17 is a perspective view of one embodiment of the present invention 1700 depicting the solar module array 1710 supported by the pallet structure. Once the solar module array 1710 is assembled by attaching the Zee-channels 810 to the plurality of solar panels 1110, the solar module array 1710 is lowered by reversing the rotation of the arm members 130 until substantially horizontal, touching the floor or the solar module array 1710 is resting on the pallet structure 1610. Raising and lowering the arm structures is optionally achieved manually, or via known mechanical, pneumatic, or other mechanisms such as gears, winches, electric so motors. When the arm members 130 are being rotated up they only bear their own weight and the weight of the Zee channels 810. When the arm members 130 are being lowered they bear the additional weight of the completed solar module array 1710 which is much heavier and so care must be taken for safe lowering of this weight.

Figure 18:
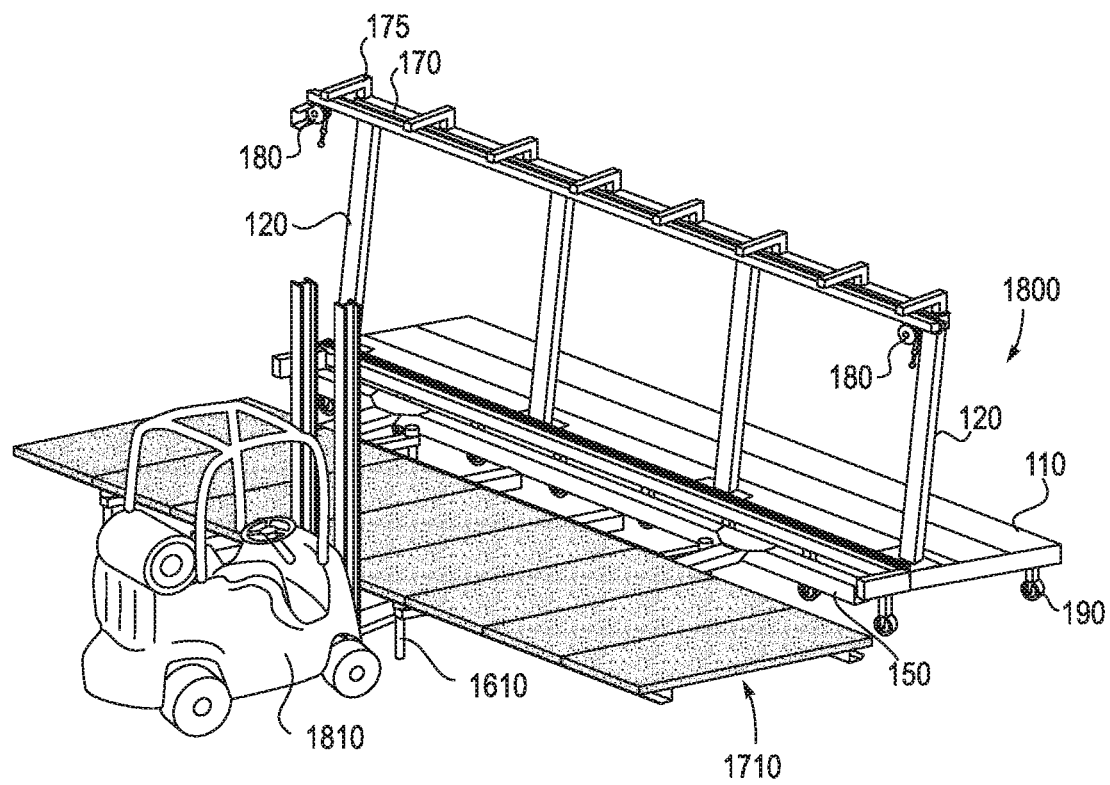
FIG. 18 is a perspective view of one embodiment of the present invention depicting the two Zee-channels attached to the plurality of solar panels, released from the arm members, supported by the pallet structure, and in position to be picked up by a fork lift.

FIG. 18 is a perspective view of one embodiment of the present invention 1800 depicting the solar module array 1710, released via clamp member 730 from the arm members 130, supported by the pallet structure 1610, and in position to be picked up by a fork lift 1810.

Figure 19:
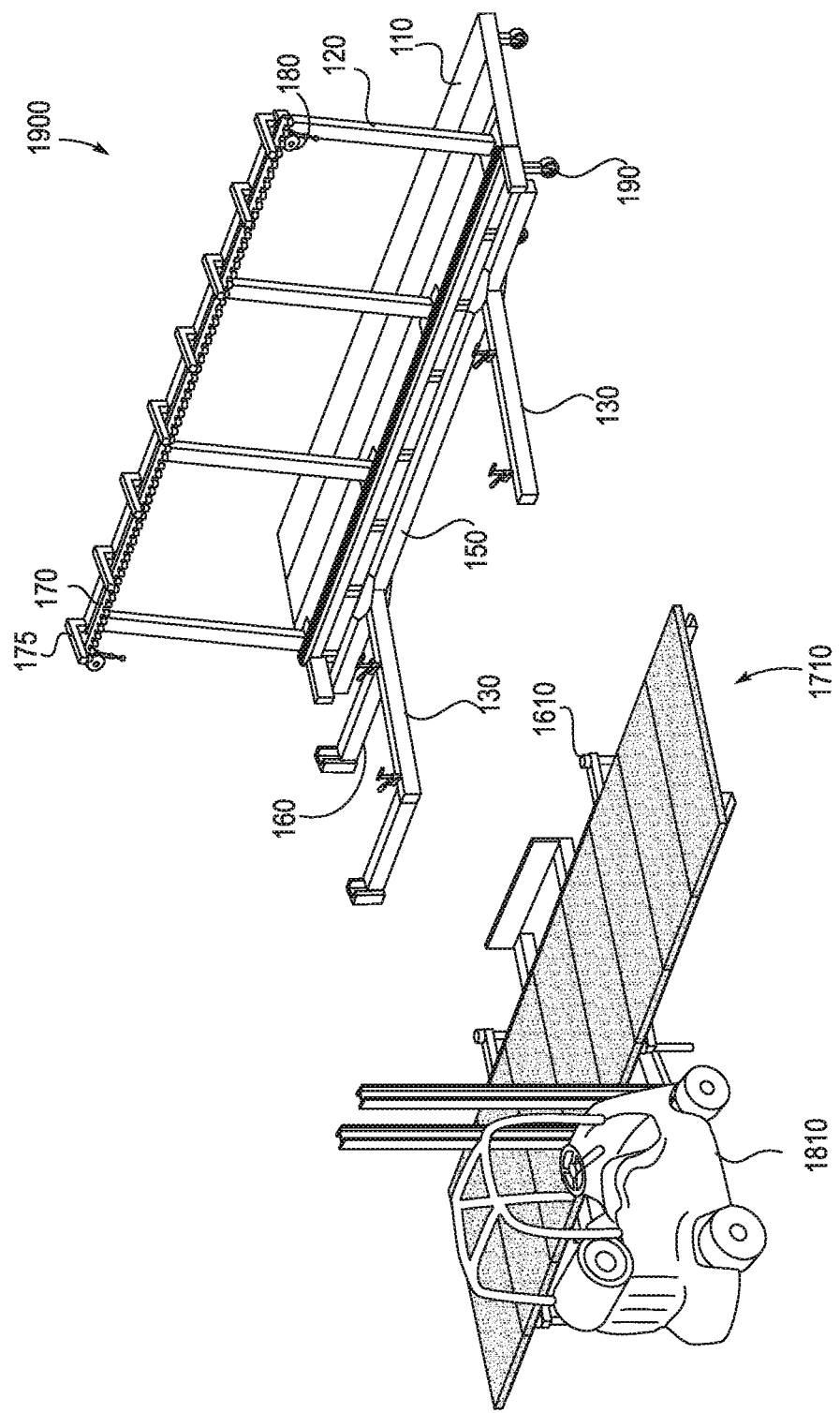
FIG. 19 is a perspective view of one embodiment of the present invention depicting the two Zee-channels attached to the plurality of solar panels, released from the arm members, supported by the pallet structure, and being removed by a fork lift for loading on a truck to take to the job site.

FIG. 19 is a perspective view of one embodiment of the present invention 1900 depicting the solar module array 1710, released via clamp member 730 from the arm members 130, supported by the pallet structure 1610, and being removed by a fork lift 1810 for loading on a truck to take to the job site.

Figure 20:
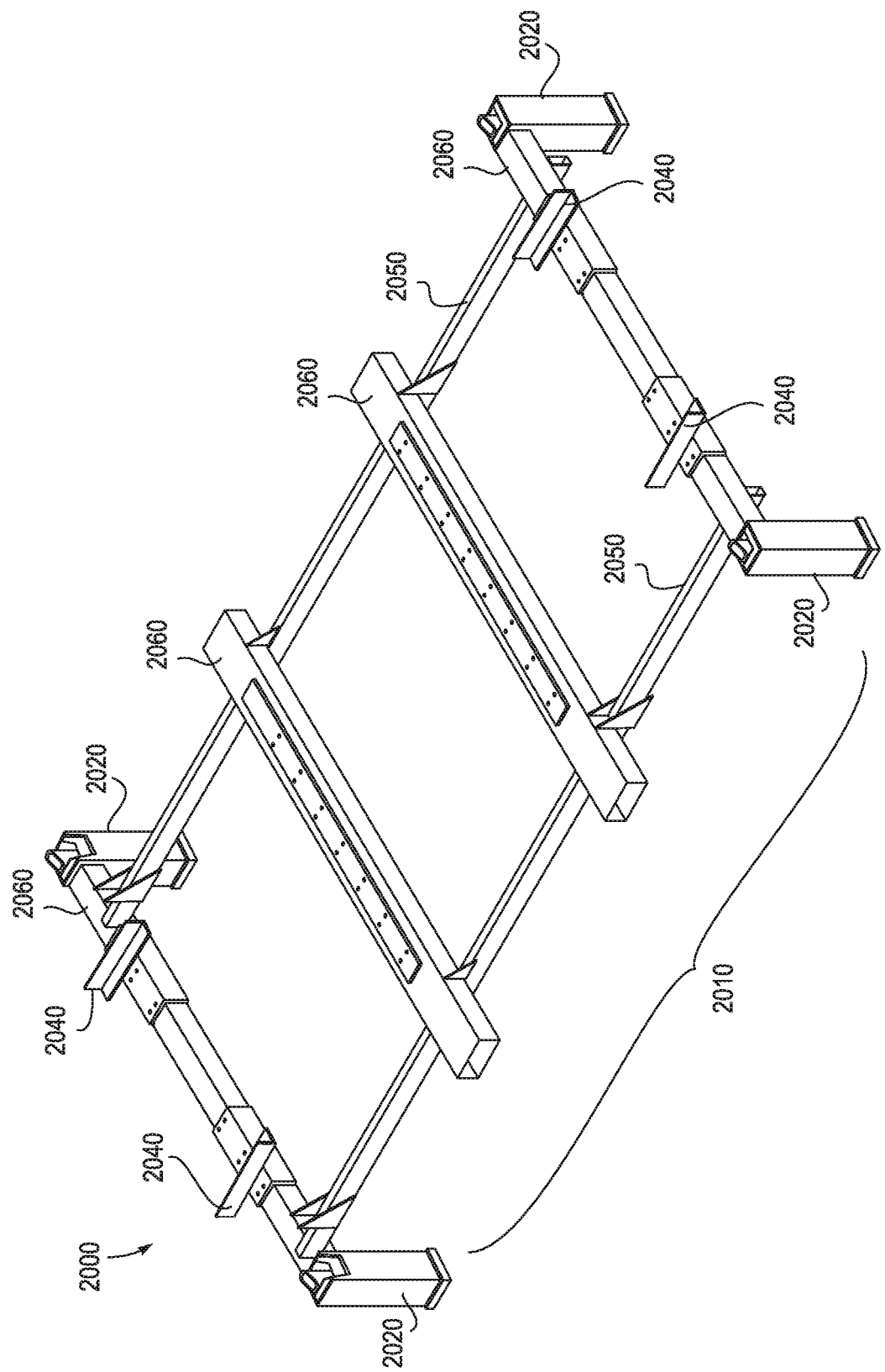
FIG. 20 is a perspective view of one embodiment of the pallet structure of the present invention.

FIG. 20 is a perspective view of one embodiment of the pallet structure/assembly 2000 of the present invention. The pallet assembly 2000 is configured and adapted for supporting the solar module array 1710, which in one embodiment is electrically connected array of a plurality of solar panels 1110 fixedly attached to Zee-channels 810 during storage and transport. The pallet assembly 2000 comprises a deck 2010 (comprised of beam members 2060 and 2050 joined); a plurality of feet 2020 extending downward from the deck a sufficient depth to allow for stacking of multiple pallet assemblies 2000 with one solar module array 1710 loaded on each pallet assembly 2000, i.e., at least the thickness of one solar module array 1710 plus any additional depth needed for stacking; a plate (not shown) attached to an edge portion of the deck 2010, for aligning the pallet assembly 2000 with the apparatus 100 (see e.g., FIG. 1) for building an electrically connected array of a plurality of solar panels, i.e., solar module array 1710; and at least one alignment bracket 2040 for aligning and preventing lateral movement of at least two solar panel support channels 810, e.g., Zee Channels, attached to the bottom of the electrically connected array of a plurality of solar panels 1110.

Other configurations of deck 2010 and feet 2020 could include, e.g., a single integral molded plastic form, a solid deck or molded deck 2010 attached to feet 2020, a box-type structure with a bottom recess to provide space for stacking, or detachable legs that, e.g., are temporarily attached to a portion of a solar module array 1710.

FIG. 21 is a top view of one embodiment of the pallet assembly 2000 of the present invention. FIG. 22 is a side view of one embodiment of the pallet assembly 2000 of the present invention. FIG. 23 is an end view of one embodiment of the pallet assembly of the present invention.

FIG. 24 is a perspective view of one embodiment of multiple stacked pallet assemblies 2400 of the present invention with completed solar module arrays 1710 loaded on each pallet structure. The upper portion and lower portions of feet 2020, shown at the 4 corners of the pallet assemblies in this embodiment, are configured and adapted for stacking by any known methods, e.g., having a recess on the upper portion and a matching protrusion on the lower portion of each foot 2020 so the feet align and stack securely when one pallet assembly is stacked on top of another pallet assembly. Alternative embodiments might include a locking latch member, snap latches, or other known connecting mechanisms. Since with stacking of pallet assemblies, the load is higher on the lower pallet assemblies, the weight capacity of each pallet assembly must be weight on the bottom pallet assembly when stacked with the maximum contemplated number of pallet assemblies. In addition, appropriate safety margins should be used, e.g., to allow for additional dynamic load when transporting the stacked pallet assemblies.

Figure 25:
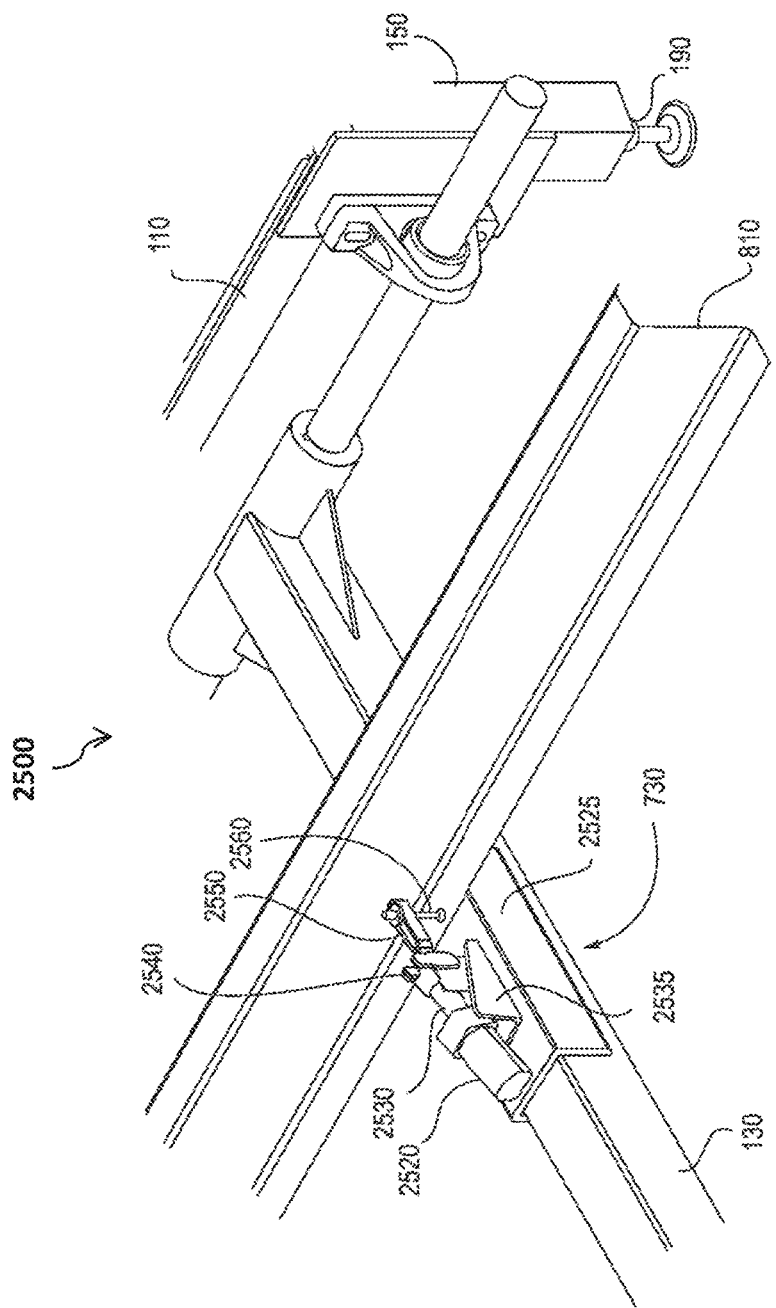
FIG. 25 is a perspective view of one embodiment of the clamp structure of the present invention.

FIG. 25 is a perspective view of one embodiment of the clamp structure 730 of the present invention 2500. A base bracket 2525 is optionally used to fixedly or movably attach clamp structure 730 to arm member 130. Pressure pin member 2560 contacts an edge portion of Zee-channel 810 and "pins" the Zee-channel to arm member 130.

FIG. 26 is an enlarged alternate perspective view of one embodiment of the clamp structure 730 of the present invention. Clamp base 2535 is fixedly attached to base bracket 2525. A pneumatic, hydraulic, electric, or manually powered ram 2520 is actuated to cause piston 2530 to move forward or backward in ram 2520. The movement of piston 2530 in rotatable coupling with hinge 2540 moves pin bracket 2550 open or closed, i.e., up or down, thereby causing pressure pin member 2560 to pin or release the Zee-channel 810. Various other clamp mechanisms and clamp actuating mechanisms may be used and are within the scope of the invention.

Other embodiments of the present invention and its individual components will become readily apparent to those skilled in the art from the foregoing detailed description. As will be realized, the invention is capable of other and different embodiments, and its several details are capable of modifications in various obvious respects, all without departing from the spirit and the scope of the present invention. Accordingly, the drawings and detailed description are to be regarded as illustrative in nature and not as restrictive. It is therefore not intended that the invention be limited except as indicated by the appended claims.

What is claimed is:

1. An apparatus for pre-assembly of an electrically connected array of solar panels for a solar canopy comprising:
   (a) a substantially planar base member for resting on a horizontal surface;
   (b) a substantially planar support member for horizontally aligning side-by-side and horizontally supporting a plurality of solar panels when a photo-voltaic cell side of the solar panels rests against the support member, wherein a bottom portion of the support member is integral with the base member or fixed attached to the base member, and the support member extends upward from the planar base member;
   (c) a track member disposed proximate a bottom portion of the support member attached to or integral with the support member or base member for vertically aligning side-by-side and vertically supporting a plurality of solar panels when a side edge portion of the solar panels rests on the track member;
   (d) at least two arm members, each having a free end and an attached end, the attached ends pivotally attached to opposing ends of the base member and each arm members having a longitudinal axis oriented substantially perpendicular to the longitudinal axis of the base member and support member and extending outward from the base member and support member, and configured to pivot in a vertical plane from a position substantially parallel to the base member upward to a position substantially parallel to the planar support member, wherein upon pivoting in one direction the free end moves closer towards the support member and pivoting in the other direction the free end moves away from the support member, the arm members being configured and adapted for removably attaching at least two solar panel support channels; and an alignment beam having a free end and a fixed end where the fixed end is movably attached perpendicularly to at least one of the two arm members and is configured and adapted for aligning and preventing lateral movement of a solar panel support channel.

2. The apparatus of claim 1, further comprising a clamp member attached to each of the arm members for removably attaching a solar panel support channel.

3. The apparatus of claim 1, wherein the support member has a height of at least half of the longitudinal axis of a solar panel it is configured to support.

4. The apparatus of claim 1, wherein the support member comprises a lattice framework.

5. The apparatus of claim 1, wherein the arm members are further configured and adapted for removably attaching at least two solar panel support channels at multiple positions and spacing along the longitudinal axis of arm members so as to be suitable for use with a plurality of solar panel sizes.

6. The apparatus of claim 1, wherein the alignment beam is adjustable along the longitudinal axis of the arm member to suit various solar panel sizes.

7. The apparatus of claim 1, further comprising a shaft member rotatably attached to a side portion of the base member and perpendicularly to attached ends of each of the arm members.

8. The apparatus of claim 7, further comprising a motor attached to the shaft member for rotating the shaft member, thereby actuating pivoting of each of the arm members.

9. The apparatus of claim 1, wherein the support member is inclined from vertical for supporting the solar panels.

10. The apparatus of claim 9, wherein the support member is inclined from about 3 degrees to about 25 degrees from vertical.

\* \* \* \* \*